US012783759B2

(12) United States Patent
Koh et al.

(10) Patent No.: US 12,783,759 B2
(45) Date of Patent: Nov. 3, 2026

(54) LITHOGRAPHY MODEL SIMULATION METHOD, PHOTOMASK GENERATING METHOD USING THE SAME, AND SEMICONDUCTOR DEVICE FABRICATION METHOD USING THE SAME

(71) Applicant: Samsung Electronics Co., Ltd., Suwon-si (KR)

(72) Inventors: Han Veen Koh, Suwon-si (KR); Soo Yong Lee, Suwon-si (KR); Moo-Joon Shin, Suwon-si (KR); Kyoung Yoon Park, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 680 days.

(21) Appl. No.: 18/350,611

(22) Filed: Jul. 11, 2023

(65) Prior Publication Data

US 2024/0036478 A1 Feb. 1, 2024

(30) Foreign Application Priority Data

Jul. 29, 2022 (KR) ........................ 10-2022-0094485

(51) Int. Cl.
*G06F 30/27* (2020.01)
*G03F 7/00* (2006.01)

(52) U.S. Cl.
CPC .......... *G06F 30/27* (2020.01); *G03F 7/70441* (2013.01); *G03F 7/705* (2013.01); *G03F 7/70625* (2013.01)

(58) Field of Classification Search
CPC ........................................................ G06F 30/27
(Continued)

(56) References Cited

U.S. PATENT DOCUMENTS 8,161,424 B2 4/2012 Fan
11,061,318 B2 7/2021 Lo et al.
(Continued)

FOREIGN PATENT DOCUMENTS

KR 2009-0066926 A 6/2009
WO WO-2018/7578 A1 1/2018

OTHER PUBLICATIONS

Optimization of accurate resist kernels through convolutional neural network, Yonghwi Kwon, Youngsoo Shin, SPIE, 8pg, Mar. 16, 2021.

(Continued)

*Primary Examiner* — Eric D Lee
(74) *Attorney, Agent, or Firm* — HARNESS, DICKEY & PIERCE, P.L.C.

(57) ABSTRACT

Provided is a lithography model simulation method. The method comprises receiving a first mask image, generating a second mask image by simulating an optical model on the first mask image, generating at least one third mask image by simulating a quenching model on the second mask image, and generating a resist image by performing machine learning on the first mask image, the second mask image, and the third mask image. The generating of the resist image comprises outputting first output data by convolving the first mask image with a first kernel, outputting second output data by convolving the second mask image with a second kernel, outputting third output data by convolving the third mask image with a third kernel, and adding together the first to third output data. Each of the first to third kernels is or includes a free-form kernel.

20 Claims, 18 Drawing Sheets

(58) Field of Classification Search
USPC .......................................................... 716/54
See application file for complete search history.

(56) References Cited

U.S. PATENT DOCUMENTS

| | | | | |
|---|---|---|---|---|
| 2013/0254725 | A1 | 9/2013 | Parikh | |
| 2017/0077138 | A1* | 3/2017 | Hong .................... | G03F 7/0035 |
| 2018/0284597 | A1 | 10/2018 | Weisbuch et al. | |
| 2022/0100935 | A1 | 3/2022 | Chen | |
| 2022/0179321 | A1* | 6/2022 | Ma ......................... | G06N 3/084 |

OTHER PUBLICATIONS

Compact resist model using single convolution kernel, Taiki Kimura, Tetsuaki Matsunawa, Shoji Mimotogi, SPIE, 7pg, Mar. 23, 2020.

* cited by examiner

LITHOGRAPHY MODEL SIMULATION METHOD, PHOTOMASK GENERATING METHOD USING THE SAME, AND SEMICONDUCTOR DEVICE FABRICATION METHOD USING THE SAME

CROSS-REFERENCE TO RELATED APPLICATION

This application claims priority from Korean Patent Application No. 10-2022-0094485 filed on Jul. 29, 2022 in the Korean Intellectual Property Office, and all the benefits accruing therefrom under 35 U.S.C. 119, the contents of which in its entirety are herein incorporated by reference.

BACKGROUND

Various example embodiments relate to a lithography model simulation method, a photomask fabrication method using the same, and/or a semiconductor device fabrication method using the same. More specifically, example embodiments relate to a lithography model simulation method for improving or optimizing a free-form kernel using a convolution neural network.

Fast and accurate lithography model simulation is important or essential for obtaining good result in optical proximity correction (OPC). Lithography models may be classified into optical models and resist models.

Generally, a kernel used in a resist model is a Gaussian function. However, in order to improve the consistency of a model, research is being conducted to replace the Gaussian function with a free-form kernel in which no constraints are imposed between entries of a kernel.

SUMMARY

Various example embodiments provide a lithography model simulation method having improved consistency of a model and reduced modeling time.

Alternatively or additionally, various example embodiments also provide a photomask fabrication method using a lithography model simulation method having improved consistency of a model and reduced modeling time.

Alternatively or additionally, various example embodiments also provide a semiconductor device fabrication method using a lithography model simulation method having improved consistency of a model and reduced modeling time.

However, example embodiments are not restricted to those set forth herein. The above and other aspects will become more apparent to one of ordinary skill in the art to which example embodiments pertains by referencing the detailed description given below.

According to some example embodiments, there is provided a lithography model simulation method comprising, receiving a first mask image, generating a second mask image by simulating an optical model on the first mask image, generating at least one third mask image by simulating a quenching model on the second mask image, and generating a resist image by performing machine learning on the first mask image, the second mask image, and the third mask image. The generating of the resist image comprises, outputting first output data by convolving the first mask image with a first kernel, outputting second output data by convolving the second mask image with a second kernel, outputting third output data by convolving the third mask image with a third kernel, and adding together the first to third output data. Each of the first to third kernels is or include a free-form kernel.

According to various example embodiments, there is provided a photomask fabrication method comprising, performing an optical proximity correction (OPC) process on a design pattern of a layout, and fabricating a photomask based on the corrected layout. The OPC process is performed using a model designed through a lithography model simulation method. The lithography model simulation method comprises, receiving a first mask image, generating a second mask image by simulating an optical model on the first mask image, generating at least one third mask image by simulating a quenching model on the second mask image, and generating a resist image by performing a convolutional neural network to the first mask image, the second mask image, and the third mask image. The generating of the resist image comprises, outputting first output data by convolving the first mask image with a first kernel, outputting second output data by convolving the second mask image with a second kernel, outputting third output data by convolving the third mask image with a third kernel, and adding together the first to third output data, and wherein each of the first to third kernels is a free-form kernel.

According to various example embodiments, there is provided a semiconductor device fabrication method comprising, providing a substrate, forming a sacrificial structure by alternately stacking insulating layers and sacrificial layers on the substrate, forming channel holes that penetrate the sacrificial structure, and replacing the sacrificial layers with gate electrodes. The forming of the channel holes comprises, provisioning a layout that defines the channel holes, performing an optical proximity correction (OPC) process on the layout using a model designed through a lithography model simulation model, and performing a photolithography process using a photomask fabricated based on the corrected layout. The lithography model simulation method comprises, receiving a first mask image, generating a second mask image by simulating an optical model on the first mask image, generating at least one third mask image by simulating a quenching model on the second mask image, and generating a resist image by performing a convolutional neural network to the first mask image, the second mask image, and the third mask image. The generating of the resist image comprises, outputting first output data by convolving the first mask image with a first kernel, outputting second output data by convolving the second mask image with a second kernel, outputting third output data by convolving the third mask image with a third kernel, and adding together the first to third output data. Each of the first to third kernels is or includes a free-form kernel. The free-form kernel is or includes a convolution kernel in which all items may independently represent arbitrary matrices.

It should be noted that the effects are not limited to those described above, and other effects of example embodiments will be apparent from the following description.

BRIEF DESCRIPTION OF THE DRAWINGS

The above and other aspects and features of example embodiments will become more apparent by describing in detail various example embodiments thereof with reference to the attached drawings, in which.

DETAILED DESCRIPTION OF THE EMBODIMENTS

Hereinafter, various example embodiments will be described with reference to the attached drawings.

Figure 1:
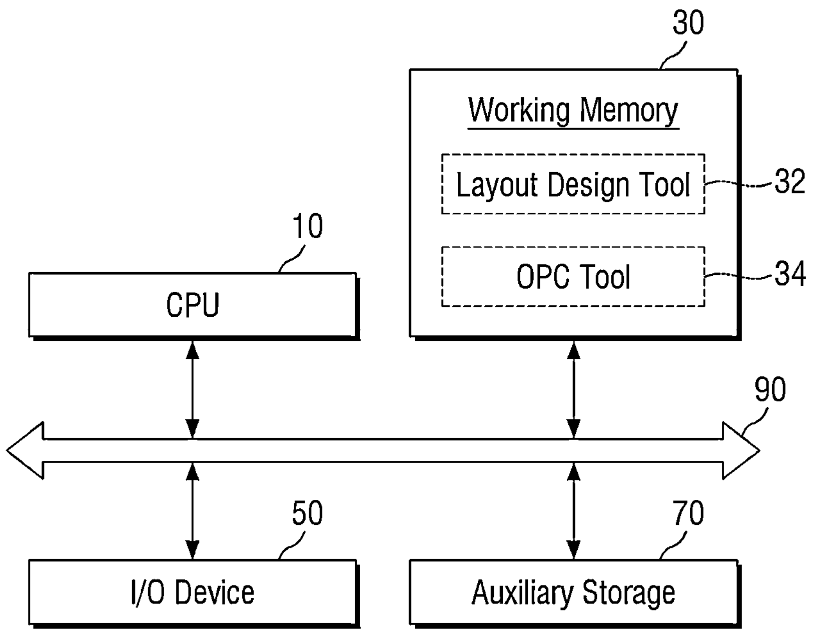
FIG. 1 is a block diagram illustrating a computer system for performing semiconductor design according to some example embodiments.

FIG. 1 is a block diagram illustrating a computer system for performing semiconductor design according to some example embodiments.

Referring to FIG. 1, a computer system may include a central processing unit (CPU) a working memory 30, an input/output (I/O) device 50, and an auxiliary storage device 70. The computer system may or may not be a customized system for performing a layout design process. The computer system may be configured to execute various design and check simulation programs.

The CPU 10 may be configured to run a variety of software (e.g., application programs, operating systems, and device drivers) in the computer system. The CPU 10 may be configured to run an operating system (OS, not shown) loaded on the working memory 30. The CPU 10 may be configured to run various application programs on the OS. For example, the CPU 10 may be configured to run a layout design tool 32 and/or an optical proximity correction (OPC) tool 34 loaded on the working memory 30.

The operating system (OS) and/or application programs may be loaded on the working memory 30. When the computer system starts a booting operation, an OS image (not shown) stored in the auxiliary storage device 70 may be loaded on the working memory 30 based on a booting sequence. In the computer system, overall input/output operations may be managed by the operating system. Some application programs, which may be selected by a user and/or be provided for basic services, may be loaded on the working memory 30. The layout design tool 32 and/or the OPC tool 34 may be loaded from the auxiliary storage device onto the working memory 30.

The layout design tool 32 may provide a bias function for changing or modifying shapes and/or positions, defined by a design tool, of specific layout patterns. In some example embodiments, the layout design tool 32 may perform a design rule check (DRC) under the changed condition obtained by the bias function.

The OPC tool 34 may perform an OPC process on the layout data output from the layout design tool 32. The working memory 30 may include at least one of a volatile memory device (e.g., a static random access memory (SRAM) device and/or a dynamic random access memory (DRAM) device), and/or a non-volatile memory device (e.g., one or more of a PRAM device, a MRAM device, a ReRAM device, a FRAM device, a NOR flash memory device).

The I/O device 50 may be configured to control input and output operations of user interface devices. For example, the I/O device 50 may include one or more of a keyboard or a monitor and may receive relevant information from a designer. By using the I/O device 50, the designer may receive information on semiconductor regions and/or on data paths which require or expect adjusted operating characteristics. The I/O device 50 may be configured to display a progress status or a process result of the OPC tool 34.

The auxiliary storage device 70 may serve as a storage medium for the computer system. The auxiliary storage device 70 may store application programs, an OS image, and various data. The auxiliary storage device 70 may be provided in the form of at least one of a memory card (e.g., one or more of MMC, eMMC, SD, or MicroSD) or a hard disk drive (HDD). The auxiliary storage device 70 may include a NAND flash memory device having a large memory capacity. Alternatively, the auxiliary storage device 70 may include at least one of next-generation non-volatile memory devices (e.g., or more of PRAM, MRAM, ReRAM, or FRAM) or NOR flash memory devices.

A system interconnector 90 may serve as a system bus for realizing a network in the computer system. The CPU 10, the working memory 30, the I/O device 50, and the auxiliary storage device 70 may be electrically connected to each other, e.g. wireless and/or wired, through the system interconnector 90, and thus, data and/or commands may be exchanged therebetween. However, the system interconnector 90 may not be limited to the aforementioned configuration. In some example embodiments, the system interconnector 90 may further include an additional element for increasing efficiency in data communication.

Figure 2:
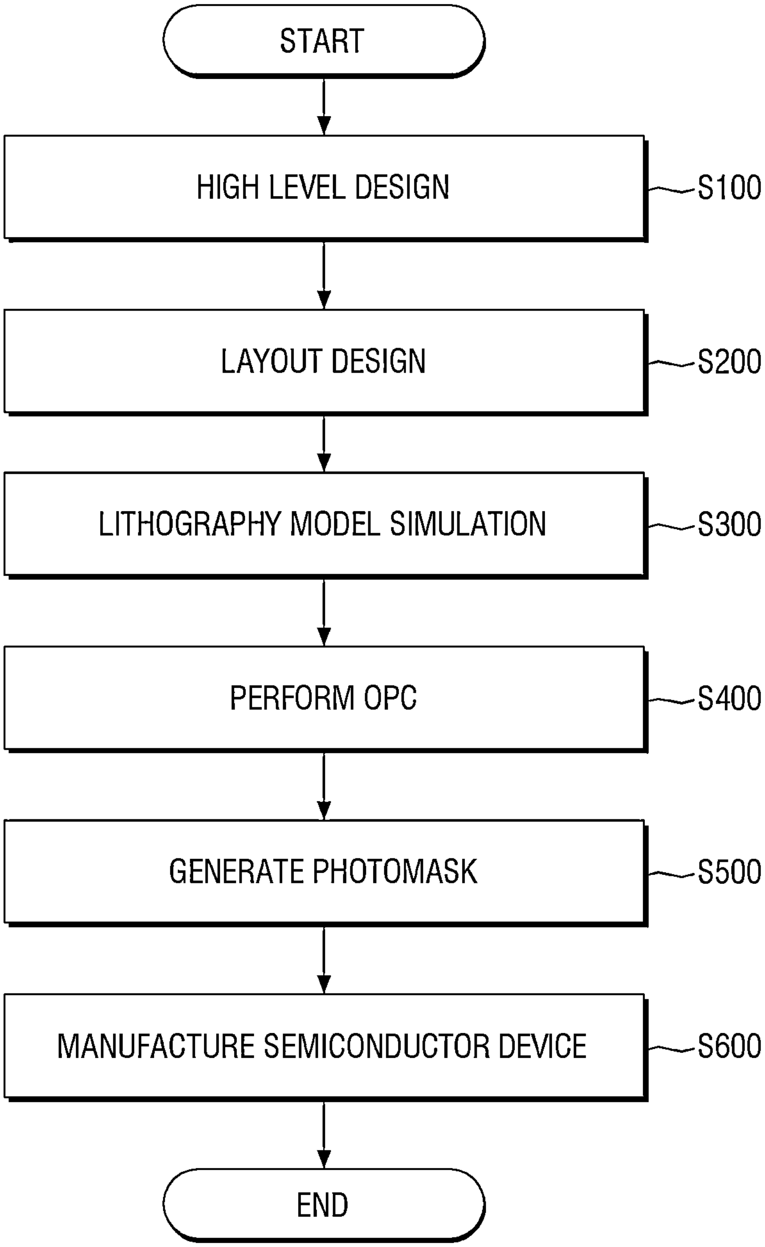
FIG. 2 is a flowchart illustrating a method of designing and fabricating a semiconductor device, according to some example embodiments.

FIG. 2 is a flowchart illustrating a method of designing and fabricating a semiconductor device, according to some example embodiments.

Referring to FIG. 2, a high-level design process of a semiconductor integrated circuit may be performed using the computer system described with reference to FIG. 1 (S100).

For example, in the high-level design process, an integrated circuit to be designed may be described in terms of high-level computer language. The high-level computer language may be, for example, C language. Circuits designed by the high-level design process may be more concretely described by a register transfer level (RTL) coding and/or a simulation. In addition, codes generated by the RTL coding may be converted into a netlist, and the results may be combined with each other to realize an entire semiconductor device. The combined schematic circuit may be verified by a simulation tool such as an electrical simulation tool such as but not limited to a SPICE simulation tool, and an adjusting operation may be further performed in consideration of a result of the verification operation.

A layout design process may be performed to realize a logically completed semiconductor integrated circuit on a silicon substrate (S200).

For example, the layout design process may be performed based on the schematic circuit prepared in the high-level design process or the netlist corresponding thereto. The layout design process may include a routing operation of placing and connecting various standard cells that are provided from a cell library, based on a design tool such as a dynamically determined and/or predetermined design tool.

The cell library for the layout design process may contain information on operation, speed, and power consumption of the standard cells. A cell library for representing a layout of a circuit having a specific gate level may be defined in the layout design tool. The layout may be prepared to define or describe shapes and sizes of patterns constituting transistors and metal interconnection lines, which will be actually formed on a silicon substrate. For example, layout patterns (e.g., PMOS, NMOS, N-WELL, gate electrodes, and metal interconnection lines thereon) may be suitably disposed to actually form an inverter circuit on a silicon substrate. For this, at least one inverter circuit defined in the cell library may be selected.

In addition, the routing operation may be performed on the selected and disposed or placed standard cells. In detail, the routing operation may be performed on the selected and disposed standard cells to connect them to upper interconnection lines. By the routing operation, the standard cells may be electrically connected to each other to meet a design. These operations may be automatically or manually performed in the layout design tool. Furthermore, an operation of placing and routing the standard cells may be automatically performed by an additional place and routing tool.

After the routing operation, a verification operation may be performed on the layout to check whether there is a portion violating the given design tool. The verification operation may include evaluating verification items, such as a design rule check (DRC), an electrical rule check (ERC), and a layout vs schematic (LVS). The evaluating of the DRC item may be performed to evaluate whether the layout meets or exceeds the given design rules. The evaluating of the ERC item may be performed to evaluate whether there is an issue of electrical disconnection in the layout. The evaluating of the LVS item may be performed to evaluate whether the layout is prepared to coincide with the gate-level netlist.

A lithography model simulation process may be performed (S300). A lithography model may include an optical model and a resist model.

The optical model is or includes or corresponds to a model for describing the formation of an aerial image by an exposure tool. The exposure tool is or includes a tool used to project a mask image onto a wafer and is also referred to as a stepper or a scanner. Therefore, the optical model may include parameters of an illumination and projection system, such as one or more of numerical aperture, partial coherence settings, illumination wavelength, illuminator source shape, and possible system defects including lens optical aberrations and flare.

The resist model is or includes or corresponds to a model for describing the absorption of an incident aerial image by resist, a development process for forming a final 3D resist pattern, etc. In some example embodiments, the resist model is a model used to simulate the effect of projection light interacting with a photosensitive resist layer, a post-exposure bake (PEB) process, and a development process.

In some example embodiments, the resist model may be generated through machine learning. The machine learning may be a convolution neural network, but example embodiments are not limited thereto.

A resist image may be generated by simulating a lithography model. The consistency of the lithography model may be determined by comparing the generated resist image with a mask image before performing the simulation. In this case, the consistency of the model may be determined by comparing the critical dimension of the mask image before performing the simulation with the critical dimension of the resist image. The lithography model simulation method will be described below.

An OPC process may be performed (S400). The OPC process may be performed based on the result of lithography model simulation. The layout patterns obtained by the layout design process may be realized on a substrate, such as on a silicon substrate, by a photolithography process. The OPC process may be performed to correct optical proximity effects which may occur in the photolithography process. Optical proximity effects may be unintended optical effects (such as refraction and/or diffraction) which may occur in the photolithography process. For example, a distortion phenomenon of layout patterns, which may be caused by the optical proximity effect, may be corrected by the OPC process. The designed shapes and positions of the designed layout patterns may be slightly changed or biased by the OPC process.

A photomask may be fabricated based on the layout modified by the OPC process (S500). In general, the photomask may be fabricated by patterning a chromium layer provided on a glass substrate, using the layout pattern data. In some example embodiments, the photomask may be fabricated using an electron-beam writing tool; however, example embodiments are not limited thereto.

A semiconductor device may be manufactured using the fabricated photomask (S600). Various exposure processes and/or etching processes may be repeated in the manufacture of the semiconductor device using one or more photomasks, e.g. one or more photomasks generated according to various example embodiments. By these processes, shapes of patterns obtained in the layout design process may be sequentially formed on a silicon substrate.

Lithography model simulation will be described below in greater detail with reference to FIGS. 3 to 5.

Figure 3:
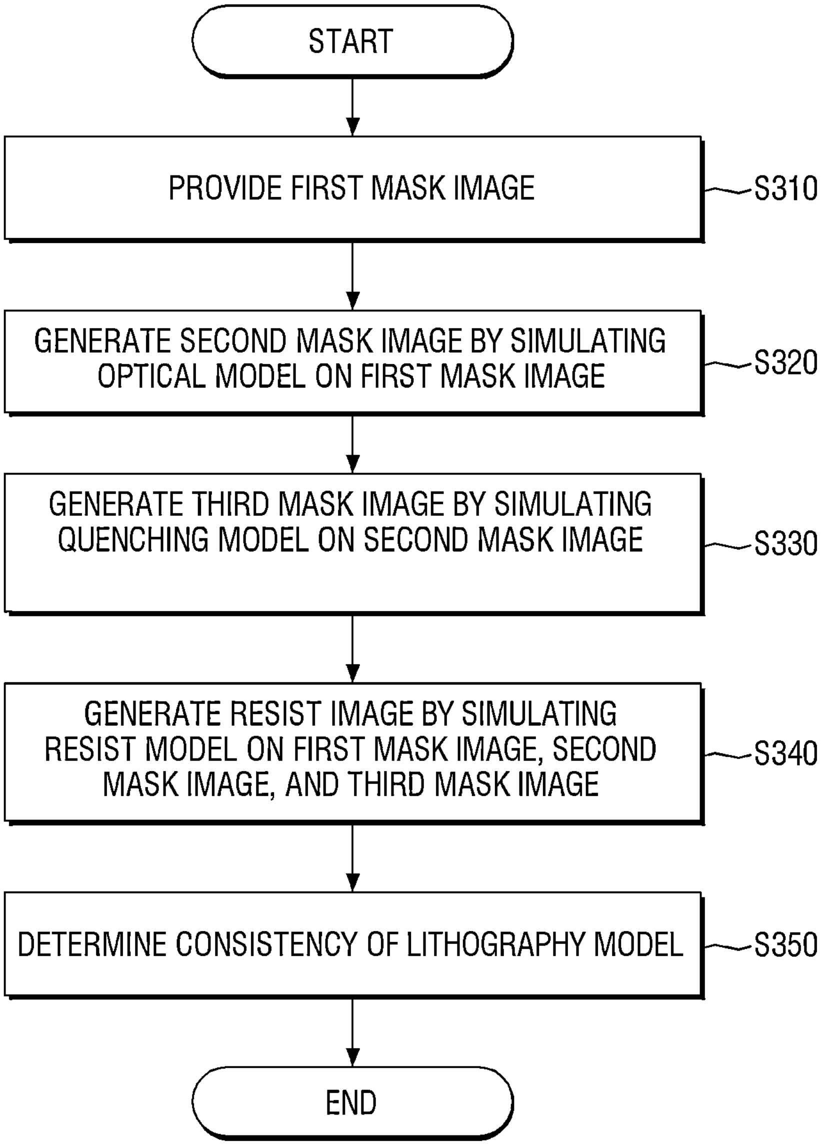
FIG. 3 is a flowchart illustrating lithography model simulation according to some example embodiments.

FIG. 3 is a flowchart illustrating lithography model simulation according to some example embodiments. FIG. 4 is a flowchart illustrating a resist model according to some example embodiments. FIG. 5 is a diagram for describing a method of determining the consistency of a lithography model according to some example embodiments.

First, referring to FIG. 3, a lithography model simulation method according to some example embodiments may include providing a first mask image MI1 (S310).

The first mask image MI1 may be a schematic shape of a photomask to be fabricated. In some example embodiments, the first mask image MI1 may be represented by a matrix such as a matrix of integers and/or of real numbers represented as floating point numbers; however, example embodiments are not limited thereto. The matrix may be, for example, a matrix of dimension 20×20, but is not limited thereto.

A second mask image MI2 may be generated by simulating an optical model on the first mask image MI1 (S320). The second mask image MI2 may be, for example, an aerial image. Like the first mask image MI1, the second mask image MI2 may be represented by a matrix such as a matrix of integers and/or of real numbers represented as floating point numbers; however, example embodiments are not limited thereto. The matrix may be, for example, a matrix of dimension 20×20, but is not limited thereto.

A third mask image MI3 may be generated by simulating a quenching model on the second mask image MI2 (S330).

Simulating a quenching model may be included in an acid-quencher mutual diffusion model (AQDM). The AQDM may include simulating a quenching model and convolving, with a kernel, an image generated by simulating the quenching model.

AQDM is or includes a model introduced to describe the interactions of complex acids and/or quenchers and mutual diffusion therebetween when a chemically amplified resist film is imaged. The AQDM may be implemented by a high-speed resist image simulator.

In some example embodiments, the third mask image MI3 includes a first sub mask image SI1 and a second sub mask image SI2. The first sub mask image SI1 may refer to a portion of the second mask image MI2 that is greater than a preset or dynamically set threshold value. The second sub mask image SI2 may refer to a portion of the second mask image MI2 that is less than the threshold value.

In some example embodiments, the third mask image MI3 may be generated through Expression 1-1 or Expression 1-2 below. In Expression 1, MI2 denotes a second mask image, e.g., an aerial image, and b0 and b 1 are constant values. At least one third mask image MI3 may be generated. A resist image RI may be generated through at least one third mask image MI3.

$$\max(MI2-b_0,0) \qquad \text{Expression 1-1}$$

$$\max(b_1-MI2,0) \qquad \text{Expression 1-2}$$

Each of the first sub mask image SI1 and the second sub mask image SI2 may be represented by a matrix, e.g. a matrix of integer or real numbers represented with floating-point arithmetic. Likewise, the third mask image MI3 may be represented by a matrix, e.g. a matrix of integers or real numbers represented with floating-point arithmetic.

The resist image RI may be generated by simulating a resist model on the first mask image MI1, the second mask image MI1, and the third mask image MI3 (S340).

Generating the resist image RI may include performing machine learning on the first mask image MI1, the second mask image MI2, and the third mask image MI3. The machine learning may be or may include machine learning with a convolution neural network, but is not limited thereto.

Figure 4:
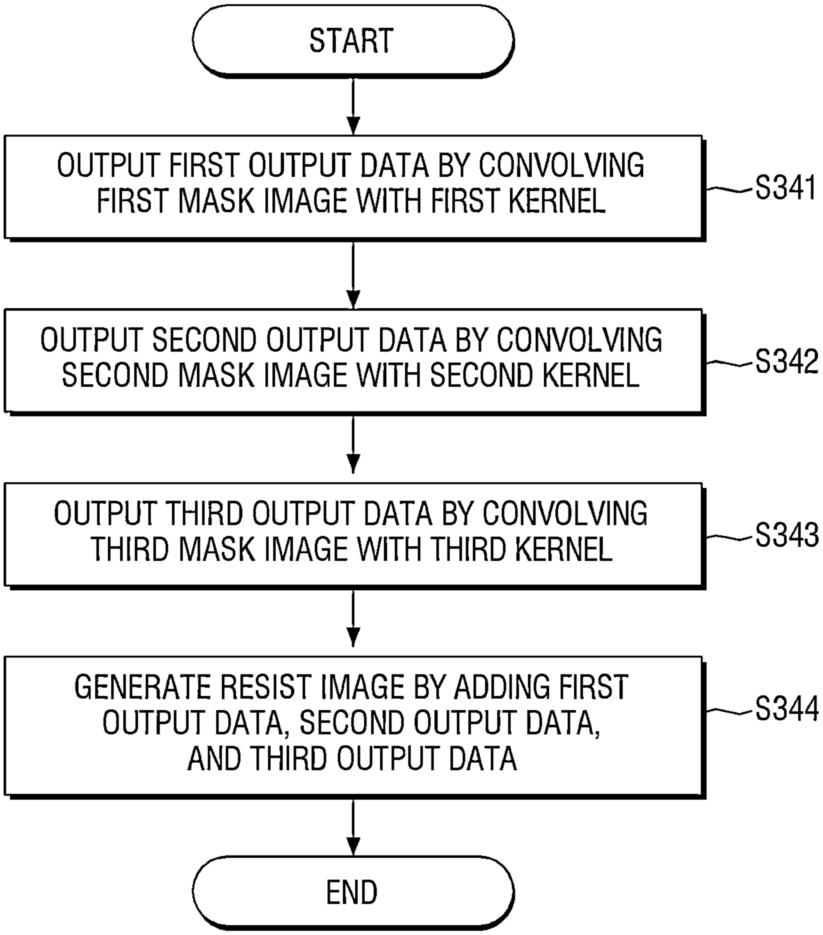
FIG. 4 is a flowchart illustrating a resist model according to some example embodiments.

For example, referring to FIG. 4, a resist model according to some example embodiments may include convolving a first mask image MI1 with a first kernel to output first output data (S341), convolving the second mask image MI2 with a second kernel to output second output data (S342), and convolving the third mask image MI3 with a third kernel to output third output data (S343).

The first mask image MI1 represented by a matrix may be convolved with the first kernel. The second mask image MI2 represented by a matrix may be convolved with the second kernel. The third mask image MI3 represented by a matrix may be convolved with the third kernel. Each of the first kernel, the second kernel, and the third kernel may be or may correspond to a free-form kernel. The free-form kernel may be a convolution kernel in which all items may independently represent arbitrary matrices.

Thereafter, the resist image RI may be generated by adding together the first out data, the second output data, and the third output data (S344).

The resist image RI generated using a resist model can be represented by the following expression.

$$RI(x,y)=MI1(x,y)\otimes K1(x,y)+MI2(x,y)\otimes K2(x,y)+MI3(x,y)\otimes K3(x,y) \qquad \text{Expression 2}$$

Referring to Expression 2, the resist image RI may be generated by convolving the first mask image MI1 with the first kernel K1, convolving the second mask image MI2 with the second kernel K2, convolving the third mask image MI3 with the third kernel K3, and adding together all convolved images.

In some example embodiments, entries in each of the first to third kernels K1, K2, and K3 may have an initial value based on a Gaussian (or normal distribution) function. However, each of the first kernel, the second kernel, and the third kernel K1, K2, and K3 may be a free-form kernel. For example, matrix entries in the first kernel K1, second kernel K2, and third kernel K3 may be drawn uniformly at random, and may not be drawn according to a Gaussian distribution.

In some example embodiments, convolving the third mask image MI3 with the third kernel K3 to output the third output data may include convolving the first sub mask image SI1 with a first sub kernel SK1 to output first sub data, convolving the second sub mask image SI2 with a second sub kernel SK2 to output second sub data, and adding together the first sub data and the second sub data.

This model can be represented by the following expression.

$$SI1(x,y)\otimes SK1(x,y)+SI2(x,y)\otimes SK2(x,y) \qquad \text{Expression 3}$$

Herein Expression 3 may replace MI3(x,y)⊗K3(x,y) term in Expression 2. However, the present disclosure is not limited thereto.

In some example embodiments, entries in each of the first and second sub kernels SK1 and SK2 has an initial value based on a Gaussian function or normal distribution function. Each of the first and second sub kernels SK1 and SK2 may be a free-form kernel.

In some example embodiments, in order to improve the consistency of a model, it is necessary or desirable to reduce the size of a pixel. However, when the size of a pixel is reduced, the number of pixels to be calculated may increase. Increase in the number of pixels to be calculated may induce high costs, e.g. high computational costs. To overcome or at least partially overcome such a drawback, an upsampling operation may be further included. The upsampling operation may be performed after generating the resist image. For example, the upsampling operation may include interpolation.

In some example embodiments, the interpolation may be Blackman-windowed sinc-interpolation, but the present disclosure is not limited thereto.

Referring back to FIG. 3, the lithography model simulation method according to some example embodiments may include determining the consistency of a lithography model (S350).

The resist image RI may be generated using the first mask image MI1 through the lithography model. According to some example embodiments, the consistency of the lithography model may be measured or determined by comparing a critical dimension of a target with the critical dimension of the generated resist image RI. The target may be a pattern obtained through an actual lithography process. In some example embodiments, the target may be obtained by photographing an actual pattern fabricated through a lithography process with a microscope.

Figure 5:
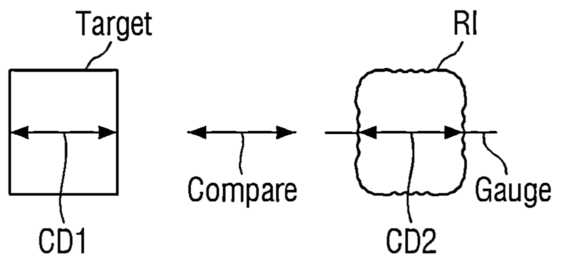
FIG. 5 is a diagram for describing a method of determining the consistency of a lithography model according to some example embodiments.

For example, in FIG. 5, the consistency of the lithography model may be determined by comparing the target and the resist image RI.

Specifically, when the resist image RI is generated, a resist contour taken at a specific threshold value may be calculated. As shown in FIG. 5, two intersections are provided at which a gauge and the resist contour intersect. A distance between the two intersections may be a critical dimension CD2 of the resist image RI.

The critical dimension of the target may be measured in a similar manner. The critical dimension of the target may be a first critical dimension CD1, and the critical dimension of the resist image RI may be a second critical dimension CD2. The consistency of the lithography model is determined by comparing the first critical dimension CD1 with the second critical dimension CD2. If the difference between the first critical dimension CD1 and the second critical dimension CD2 is small, it may be determined that the lithography model has high consistency.

The consistency of a model may be improved by using the lithography model simulation method according to some example embodiments. A free-form kernel may be used as a kernel in the resist model, the consistency of the model may be improved and/or the modeling time may be reduced.

Effects of the lithography model simulation method according to some example embodiments will be described in greater detail with reference to Table 1 below.

Table 1 shows comparison of consistency of a model, time required for modeling, the number of cores used in modeling, and consistency of modeling result between a comparative example and various embodiments, with arbitrary units. The comparative example uses a Gaussian function and the example uses a free-form kernel. The comparative example and the example are compared on the assumption that a value of each item in the comparative example is 1.

TABLE 1

| | Comparative Example | Example Embodiments |
|---|---|---|
| Model Consistency | 1 | 0.82 |
| Time required for modeling | 1 | 0.026 |
| Number of cores | 1 | 0.0014 |
| Consistency | 1 | 0.72 |

Referring to Table 1, when the model consistency of the comparative example is 1, the model consistency of the example may be 0.82.

However, when the time required for modeling of the comparative example is 1, the time required for modeling of the example may be 0.026. In the example, the time required or used for modeling may be approximately 40 times shorter than that in the comparative example. When the number of cores used in modeling in the comparative example is 1, the number of cores in the example may be 0.0014. The number of cores may be or correspond to the number of CPUs utilized in modeling. For example, the number of cores in the comparative example may be approximately 700 times or more than the number of cores in the example. As compared to the comparative example, the example may perform modeling with fewer cores and in a shorter time. Therefore, in the example, modeling may be performed with less cost incurred compared to the comparative example.

When the consistency of the comparative example is 1, the consistency of the example may be 0.72.

In summary, as compared to or instead of the lithography model simulation using a Gaussian kernel, the lithography model simulation using a free-form kernel may allow for improving the consistency of modeling and/or reducing modeling time, and/or obtaining a consistent result of modeling, by using fewer cores, and/or reducing costs due to the shortened modeling time.

Figure 6:
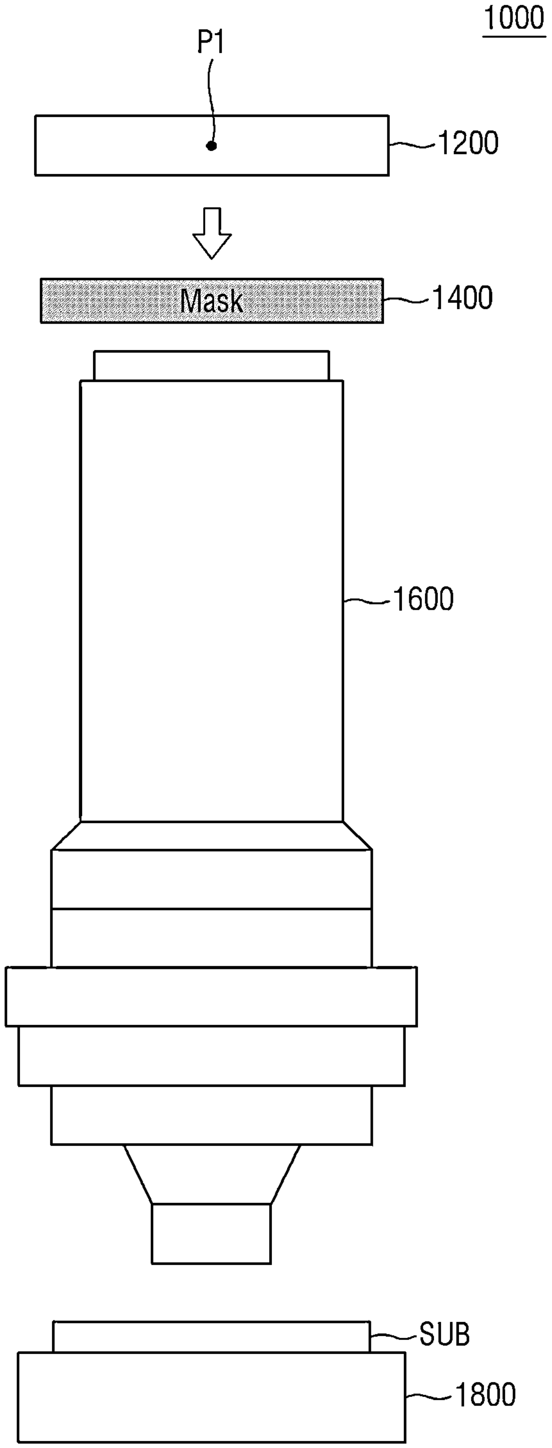
FIG. 6 is a schematic diagram illustrating a photolithography system, in which a photomask according to some example embodiments is used.

FIG. 6 is a schematic diagram illustrating a photolithography system, in which a photomask according to some example embodiments is used.

A photolithography system 1000 may include a light source 1200, a photomask 1400, a reduction projection apparatus 1600, and a substrate stage 1800. The photolithography system 1000 may further include a sensor for measuring a height and a slope of a top surface of a substrate SUB.

The light source 1200 may be configured to emit light. The light emitted from the light source 1200 may be incident onto the photomask 1400. To control a focal length, a lens may be provided between the light source 1200 and the photomask 1400. The light source 1200 may be configured to emit an ultraviolet light. For example, the light source 1200 may be one or more of a krypton-fluorine (KrF) light source (at 234 nm), an argon-fluorine (ArF) light source (at 193 nm), or an extreme ultraviolet (EUV) light source. Preferably, the light source 1200 according to some example embodiments may be an EUV light source. The light source 1200 may include a single point light source P1, but example embodiments are not limited thereto. In some example embodiments, the light source 1200 may include a plurality of point light sources.

The photomask 1400 may include image patterns, which are used to transcribe or print the designed layout onto the substrate SUB. The image patterns may be formed based on layout patterns which are prepared through layout design, lithography model simulation, and OPC steps described above. The image patterns may be defined by transparent and opaque regions formed on the photomask 1400. The transparent region may be formed by etching a metal layer (e.g., a chromium layer) that is provided on the photomask 1400. The transparent region may transmit light emitted from the light source 1200. By contrast, the opaque region may not transmit light but may block light.

The reduction projection apparatus 1600 may be configured to receive light transmitted through the transparent region of the photomask 1400. The reduction projection apparatus 1600 may be configured to match layout patterns, to be printed or patterned onto the substrate SUB, with the image patterns of the photomask 1400. The light may be incident onto the substrate SUB through the reduction projection apparatus 1600. As a result, patterns that have shapes corresponding to the image patterns of the photomask 1400 may be formed on the substrate SUB.

The substrate stage 1800 may support the substrate SUB. For example, the substrate SUB may include a wafer such as a silicon wafer. The reduction projection apparatus 1600 may include an aperture. The aperture may be used to control a depth of focus of the ultraviolet light emitted from the light source 1200. As an example, the aperture may include a dipole or quadruple aperture. The reduction projection apparatus 1600 may further include a lens for controlling a focal length.

As an integration density of a semiconductor device increases, a distance between the image patterns of the photomask 1400 may be reduced, thereby causing an optical proximity issue such as undesired interference and diffraction. As a result of the optical proximity issue, the patterns formed on the substrate SUB may have distorted shapes. The distortion of the patterns may lead to malfunction of an electronic device or circuit that is formed on the substrate SUB.

A resolution enhancement technology (RET) may be used to prevent the distortion of the patterns. An OPC technology may be an example of the resolution enhancement technology. According to the OPC technology, the optical distortion issue, which is caused by interference and diffraction, may be at least partly quantitatively predicted by a simulation process using an OPC model. The designed layout may be changed based on the predicted result. Based on the changed layout, image patterns may be formed on the photomask 1400. Thus, the patterns may be formed in desired or more desired/intended shapes on the substrate SUB.

A layout of a semiconductor device may include a plurality of layers. In some example embodiments, the OPC process may be performed to correct or at least partially correct a layout for each of the layers. In other words, the OPC process may be independently performed on each of the plurality of layers. A semiconductor device may be fabricated by forming the plurality of layers on a substrate through a semiconductor process. As an example, a semiconductor device may include a plurality of stacked metal layers constituting a specific circuit.

FIGS. 7 to 10 are diagrams for describing a photomask fabrication method according to various example embodiments.

Figure 7:
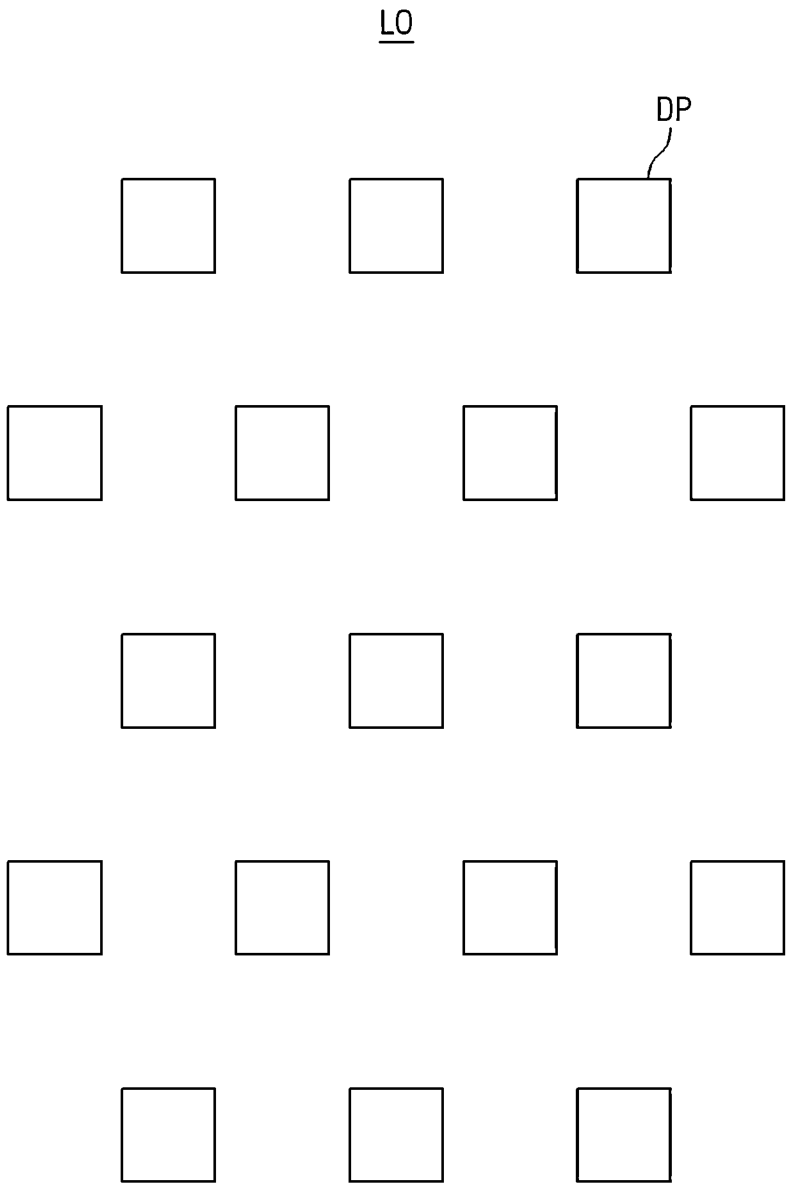
FIGS. 7 to 10 are diagrams for describing a photomask fabrication method according to some example embodiments.

Referring to FIG. 7, a layout LO may be provided, which may be generated through the layout design process described above with reference to FIG. 2. The layout LO may be a layout of a single layer. For example, the layout LO of FIG. 7 may be a layout that defines channel holes, which may be formed in a three-dimensional semiconductor memory device (e.g., a vertical NAND (VNAND) device).

The layout LO may include a plurality of design patterns DP. In some example embodiments, the design patterns DP may have the same shape and/or the same size. Alternatively, the design patterns DP may have one or more shapes and sizes that are different from each other.

Figure 8:
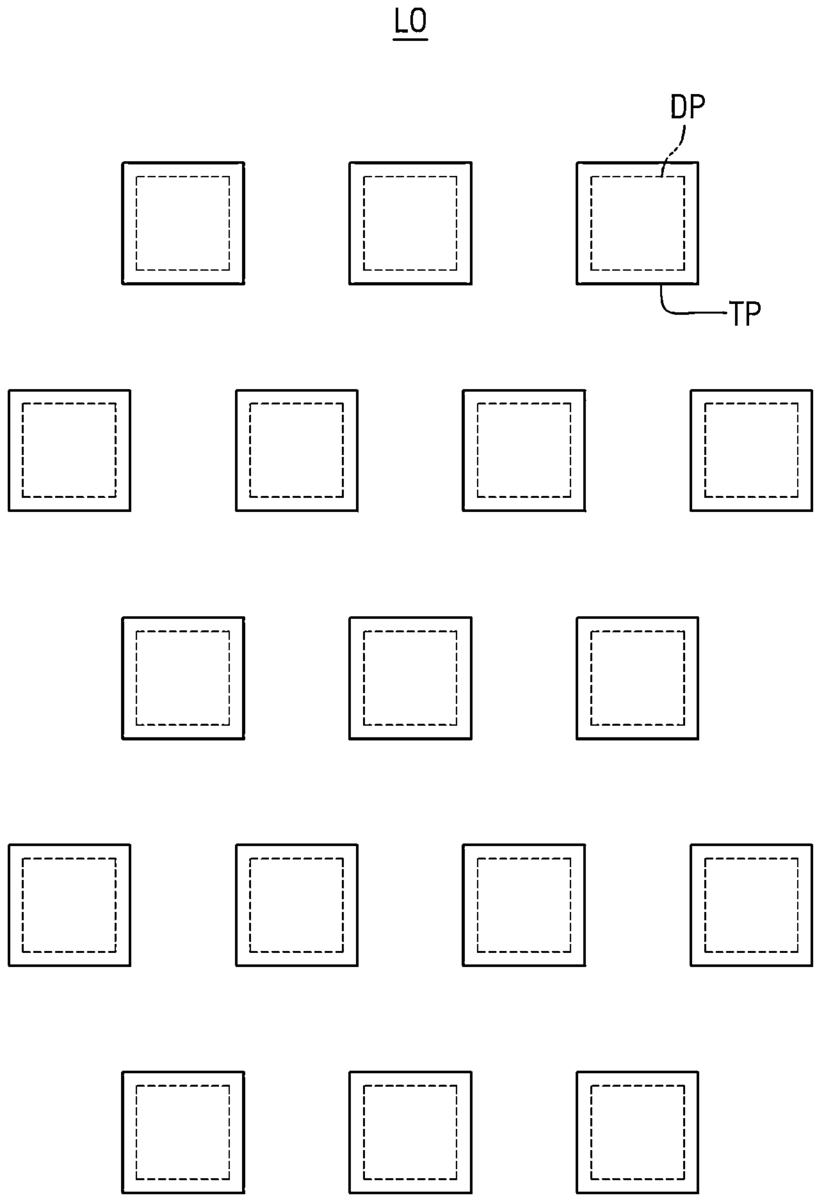

Referring to FIG. 8, target patterns TP may be generated for the design patterns DP. The target pattern DTP may be generated based on a result of the lithography model simulation described above with reference to FIGS. 3 to 5. The target pattern TP may be generated to define a size of a pattern, which will be formed by developing a photoresist layer during a photolithography process. For example, the target pattern TP may be generated to define a desired or intended size of the photoresist pattern which will be actually formed by the developing operation.

Figure 9:
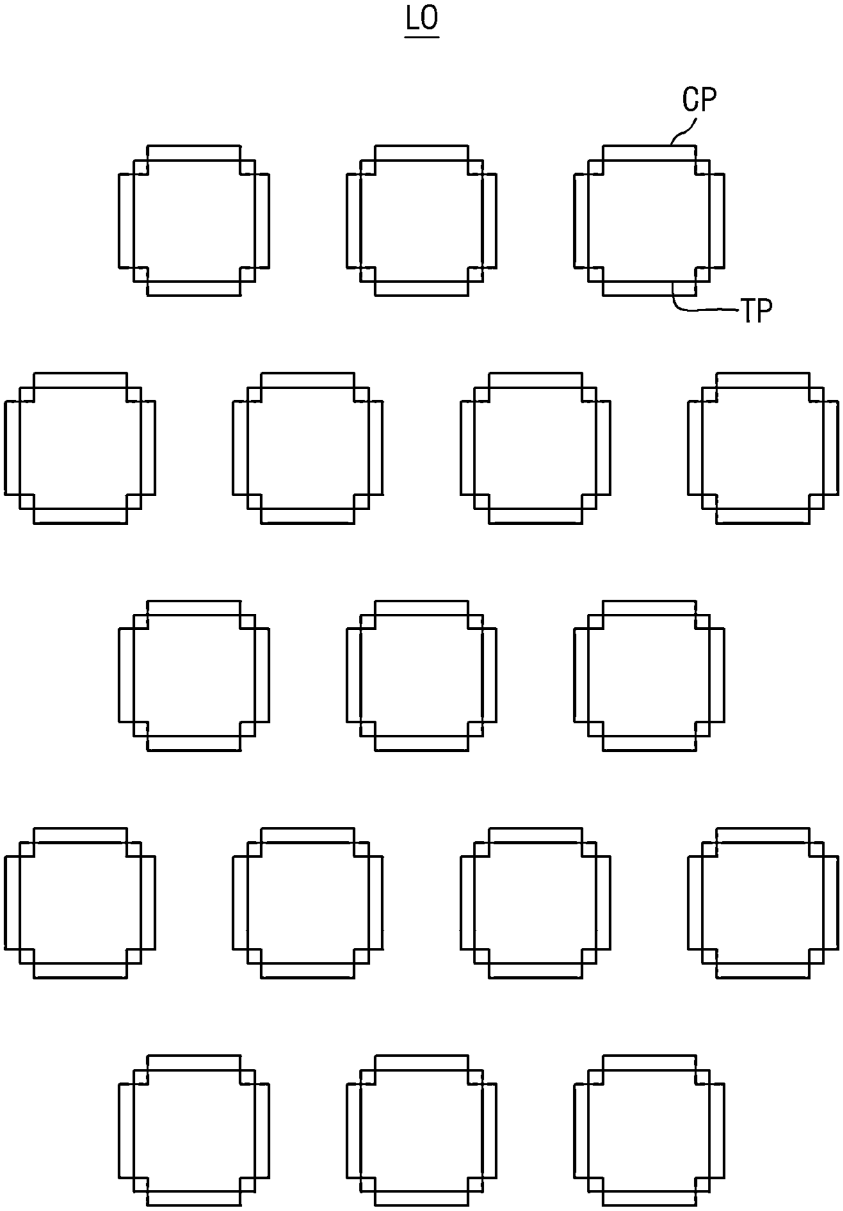

Referring to FIG. 9, an OPC operation may be performed on the design patterns DP to generate correction patterns CP1. The OPC operation may be performed under a mask rule.

In detail, the correction pattern CP may be generated for each of the design patterns DP, based on the previously-generated corresponding target pattern TP.

Figure 10:
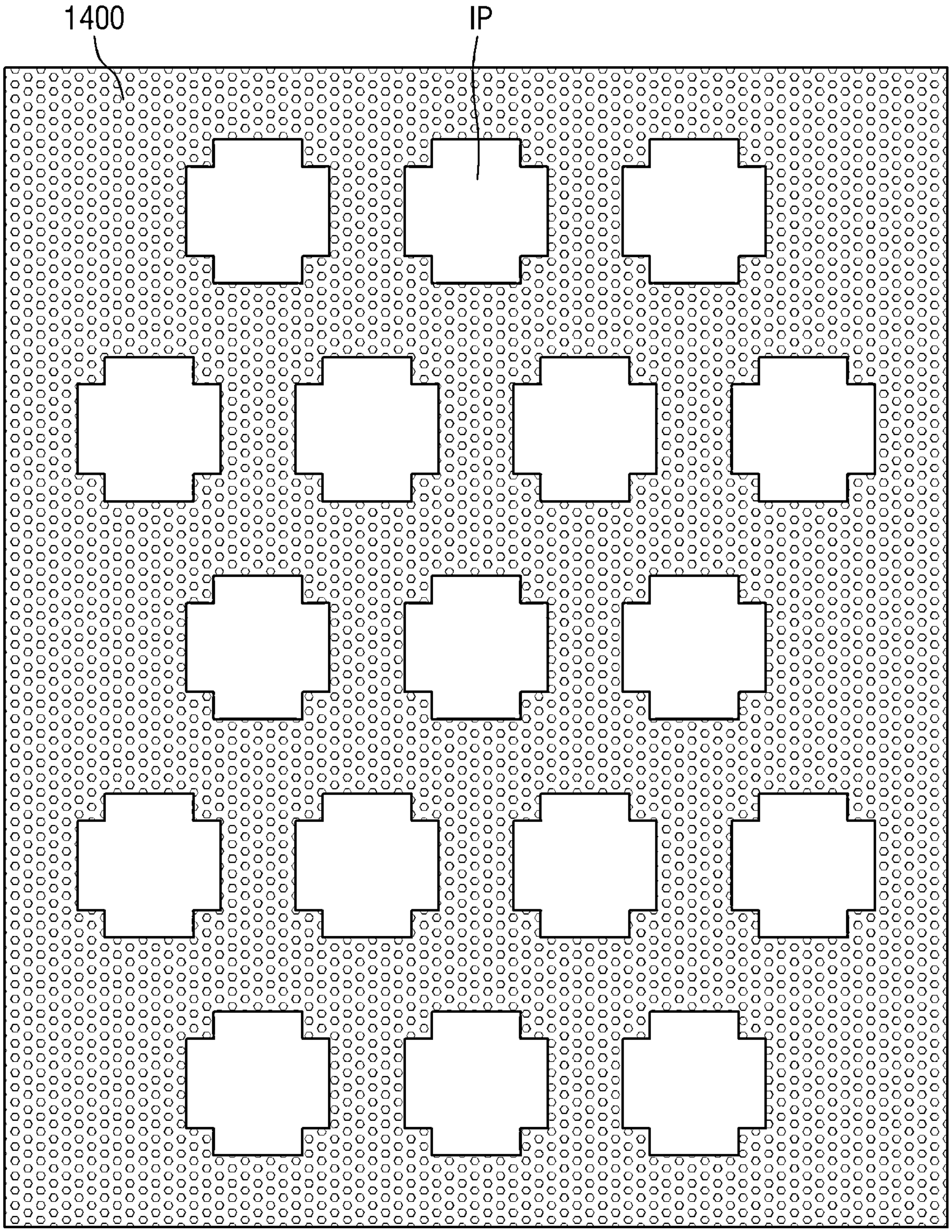

Referring to FIG. 10, the photomask 1400 may be fabricated based on the correction patterns CP. The photomask 1400 may include image patterns IP. The image patterns IM may be formed according to the correction patterns CP.

Figure 11:
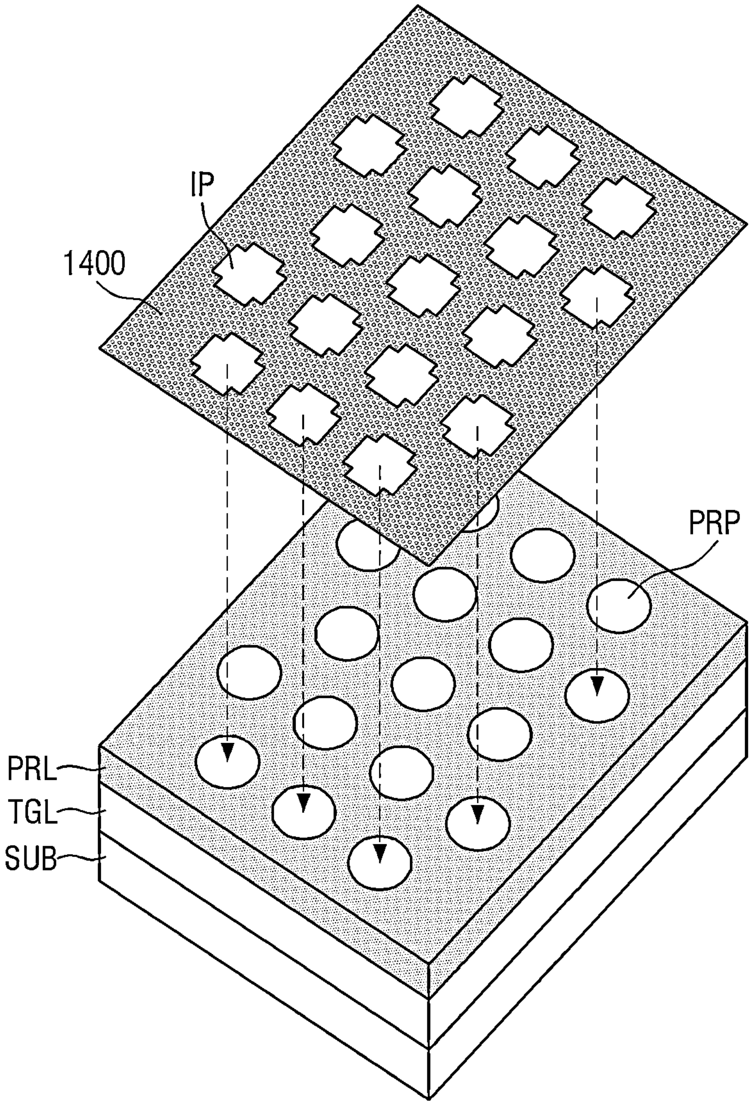
FIG. 11 is a schematic diagram for describing a method of forming photoresist patterns on a substrate using the photomask of FIG. 10.

FIG. 11 is a schematic diagram for describing a method of forming photoresist patterns on a substrate using the photomask of FIG. 10.

Referring to FIG. 11, the light source 1200 of FIG. 3 may emit light toward the photomask 1400. The emitted light may pass through the transparent region of the image patterns IM and may be incident onto a photoresist layer PRL on the substrate SUB (e.g., through an exposure process). A region of the photoresist layer PRL, onto which the light is incident, may become a photoresist pattern PRP.

In a subsequent developing process, all regions of the photoresist layer PRL other than the photoresist patterns PRP may be removed, and the photoresist patterns PRP may remain or not be removed. An etching target layer TGL on the substrate SUB may be patterned using the photoresist patterns PRP as an etch mask. Thus, desired target patterns may be formed on the substrate SUB. Subsequently after etching the remaining photoresist patterns PRP may be removed (e.g., with a stripping process). As a result, a semiconductor device may be fabricated by forming target patterns in each layer using this method.

FIGS. 12 to 18 are views for describing a semiconductor device fabrication method according to some example embodiments. Although in FIGS. 12 to 18, a semiconductor device is illustrated as a flash memory device, the present disclosure is not limited thereto.

Figure 12:
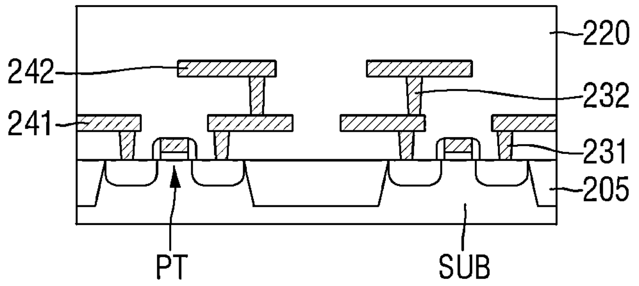
FIGS. 12 to 18 are views for describing a semiconductor device fabrication method according to some example embodiments.

Referring to FIG. 12, a substrate SUB may be provided. The substrate SUB may include a semiconductor substrate, e.g., one or more of a silicon substrate, a germanium substrate, or a silicon-germanium substrate. Alternatively, the substrate SUB may be a silicon-on-insulator (SOI) substrate and/or a germanium-on-insulator (GOI) substrate.

Device isolation layers 205 may be formed in the substrate SUB. The device isolation layer 205 may be a shallow trench isolation (STI) layer. The device isolation layers 205 may define active regions of peripheral circuit element PT. The device isolation layer 205 may include an insulating material. The device isolation layer 205 may include at least one of, for example, silicon nitride, silicon oxide, or silicon oxynitride.

A peripheral interlayer insulating layer 220 may be formed on the substrate SUB. The peripheral interlayer insulating layer 220 may include an insulating material. For example, the peripheral interlayer insulating layer 220 may include a silicon oxide layer, but the present disclosure is not limited thereto.

The peripheral circuit element PT, contacts 231 and 232, and interconnection patterns 241 and 242 may be formed in the peripheral interlayer insulating layer 220 on the substrate SUB.

The peripheral circuit element PT may be formed on the substrate SUB. The peripheral circuit element PT may form a peripheral circuit that controls an operation of the semiconductor device. The peripheral circuit element PT may include, e.g., a transistor, but is not limited thereto. For example, the peripheral circuit element PT may include various active elements such as a transistor and/or a diode, as well as various passive elements such as a memristor, a capacitor, a resistor, and an inductor.

The contacts 231 and 232 may electrically connect a source/drain of the peripheral circuit element PT to the interconnection patterns 241 and 242. The contacts 231 and 232 and the interconnection patterns 241 and 242 may include a conductive material.

Figure 13:
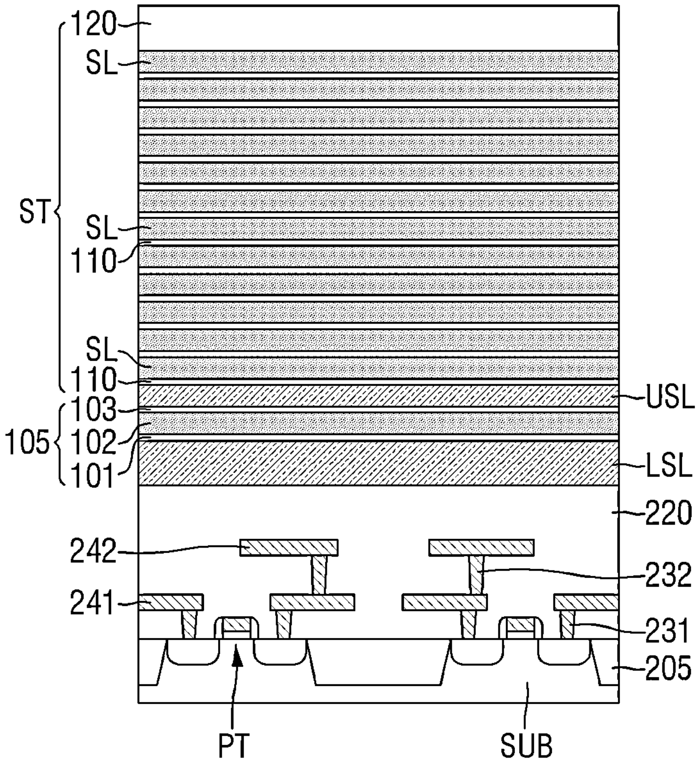

Referring to FIG. 13, a lower semiconductor layer LSL may be formed on the peripheral interlayer insulating layer 220.

For example, the lower semiconductor layer LSL may be made of a semiconductor material such as doped or undoped polysilicon. A lower insulating layer 105 may be formed on the lower semiconductor layer LSL. Forming the lower insulating layer 105 may include sequentially stacking a first sub insulating layer 101, a lower sacrificial layer 102, and a second sub insulating layer 103 on the lower semiconductor layer LSL. The first sub insulating layer 101 and the second sub insulating layer 103 may include a silicon oxide layer. The lower sacrificial layer 102 may include a silicon nitride layer or a silicon oxynitride layer. An upper semiconductor layer USL may be formed on the lower sacrificial layer 102.

For example, the upper semiconductor layer USL may include a semiconductor material such as polysilicon.

A sacrificial structure ST may be formed on the upper semiconductor layer USL. Specifically, the sacrificial structure ST may be formed by alternately stacking insulating layers 110 and sacrificial layers SL on the upper semiconductor layer USL. A first interlayer insulating layer 120 may be formed on the top of the sacrificial structure ST.

The insulating layers 110, the sacrificial layers SL, and the first interlayer insulating layer 120 may be formed by using one or more of a thermal deposition process, a chemical vapor deposition (CVD) process, a plasma enhanced CVD process, a physical CVD process, or an atomic layer deposition (ALD) process. The insulating layers 110 and the first interlayer insulating layer 120 may include a silicon oxide layer, and the sacrificial layers SL may include a silicon nitride layer or a silicon oxynitride layer. However, example embodiments are not limited thereto.

Figure 14:
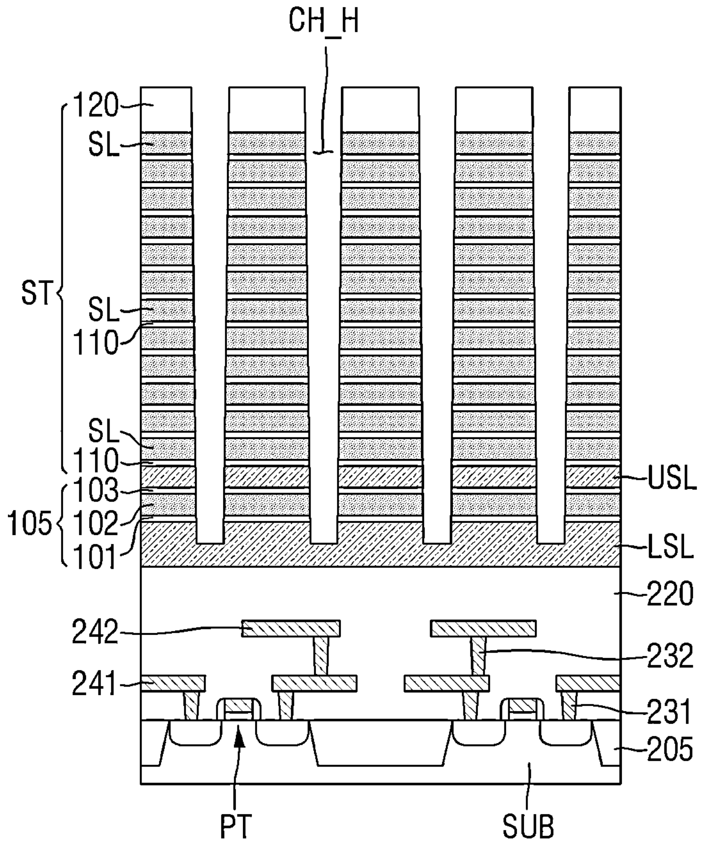

Referring to FIG. 14, channel holes CH_H may be formed to penetrate the sacrificial structure ST.

In detail, a patterning process for forming channel holes CH_H may use the photolithography process described above with reference to FIGS. 1 to 11. The photomask 1400 described above with reference to FIG. 10 may be used as a photomask for forming the channel holes CH_H. The photomask for forming the channel holes CH_H may be fabricated through the OPC method described above with reference to FIGS. 7 to 10. The OPC method may be performed with reference to the lithography model simulation method described with reference to FIGS. 3 to 5.

When viewed in a plan view, the channel holes CH_H may be arranged in a specific direction or in a zigzag shape.

Figure 15:
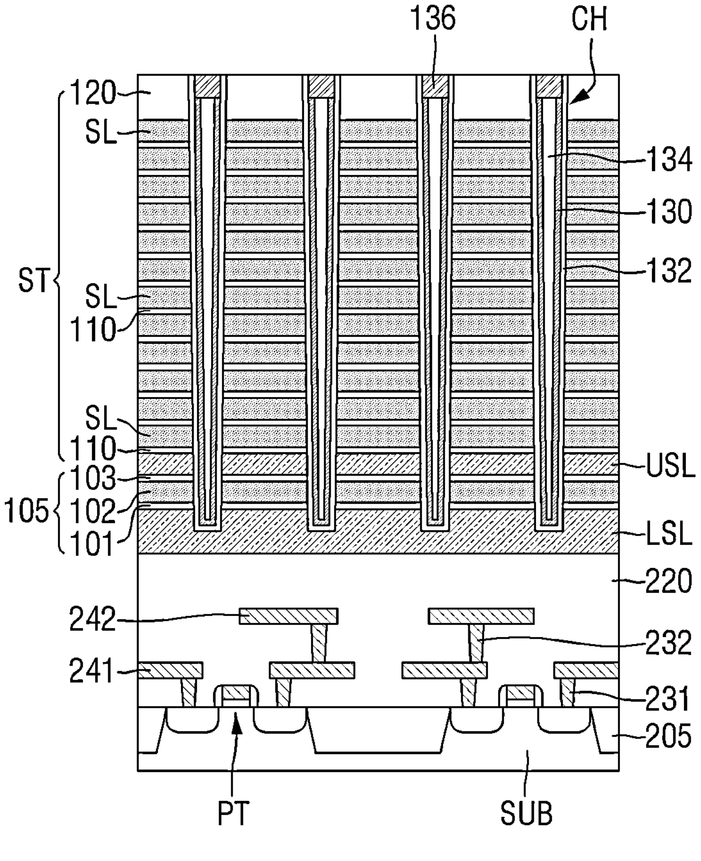

Referring to FIG. 15, channel structures CH may be formed in the channel holes CH_H. A channel pad 136 may be formed on each of the channel structures CH.

Specifically, an information storage layer 132 is formed on an inner surface of each channel hole CH_H. A semiconductor pattern 130 may be formed on the information storage layer 132. A filling pattern 134 is formed on the semiconductor pattern 130. The information storage layer 132, the semiconductor pattern 130, and the filling pattern will be described further below.

A channel pad 135 may be formed to be coupled to the semiconductor pattern 130. The channel pad 136 may include, for example, polysilicon doped with impurities, but example embodiments are not limited thereto.

Figure 16:
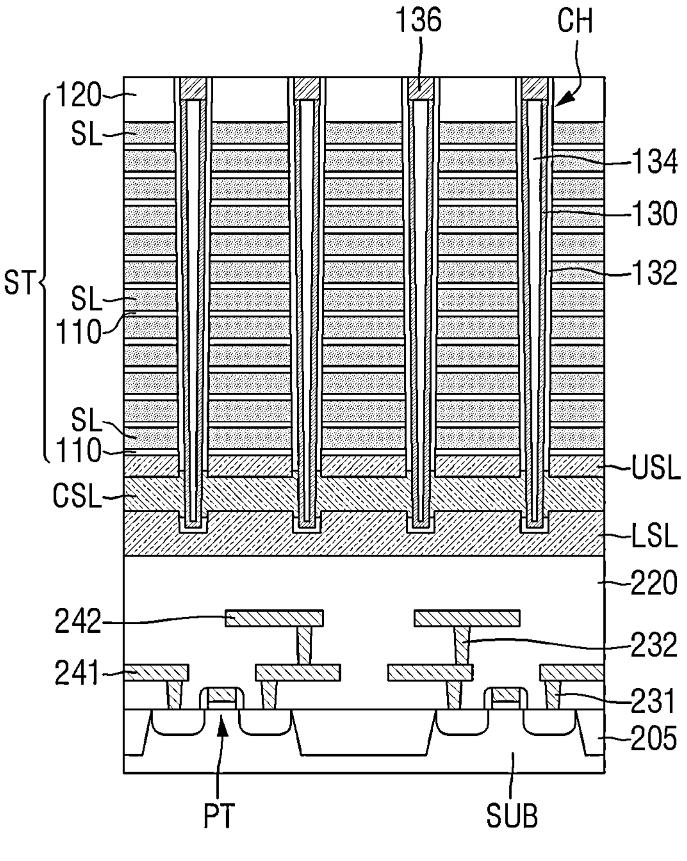

Referring to FIG. 16, the first sub insulating layer 101, the lower sacrificial layer 102, and the second sub insulating layer 103 may be removed, and a common source plate CSL may be formed at the position where the lower insulating layer is removed. The common source plate CSL may be coupled to the semiconductor patterns 130 of the channel structures CH. The common source plate CSL may include a semiconductor material such as doped or undoped polysilicon.

Figure 17:
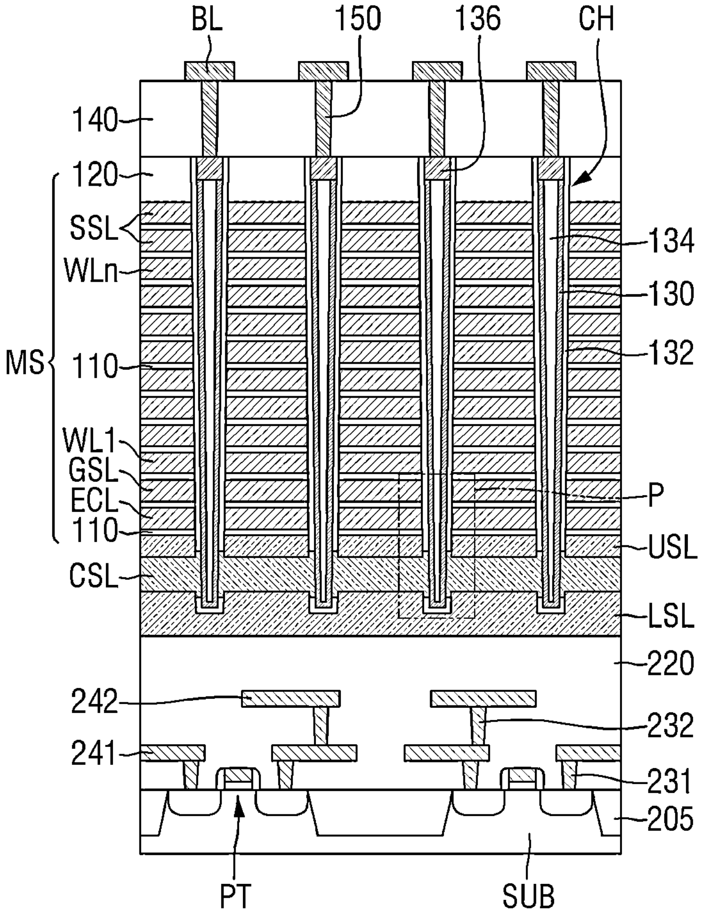
Figure 18:
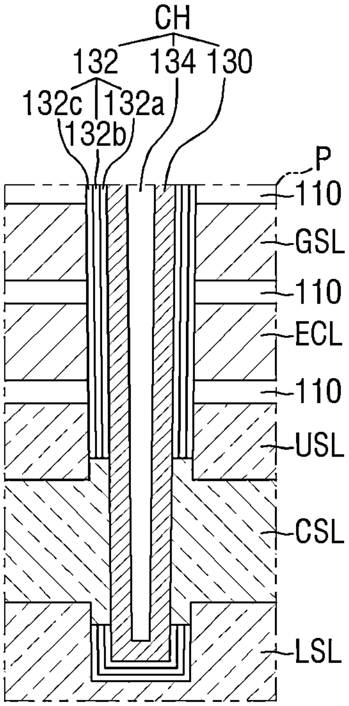

Referring to FIGS. 17 and 18, the sacrificial layers SL may be replaced with gate electrodes ECL, GSL, WL1 to WLn, and SSL. As a result, a mold structure MS may be formed. The mold structure MS may be configured by alternately stacking the insulating layers 110 and the gate electrodes ECL, GSL, WL1 to WLn, and SSL.

In FIG. 18, the information storage layer 132 may be formed as a multi-layer. For example, the information storage layer 132 may include a tunnel insulating layer 132*a*, a charge storage layer 132*b*, and a blocking insulating layer 132*c*, which are sequentially stacked on an outer side surface of the semiconductor pattern 130.

The tunnel insulating layer 132*a* may include, for example, silicon oxide or a high-k material having a higher dielectric constant than silicon oxide (e.g., aluminum oxide (Al2O3) or hafnium oxide (HfO2)). The charge storage layer 132*b* may include, for example, silicon nitride. The blocking insulating layer 132*c* may include, for example, silicon oxide or a high-k material having a higher dielectric constant than silicon oxide (e.g., aluminum oxide (Al2O3) or hafnium oxide (HfO2)).

The common source plate CSL may penetrate the information storage layer 132 and be connected to the semiconductor pattern 130. The filling pattern 134 may be disposed or arranged on the semiconductor pattern 130 and filled in the channel holes CH_H.

Referring back to FIG. 17, a second interlayer insulating layer 140 may be formed on the mold structure MS. The second interlayer insulating layer 140 may include, for example, a silicon oxide layer. Bit line contacts 150 may be formed to penetrate the second interlayer insulating layer 140. Each bit line contact 150 may be coupled to an upper portion of each channel structure CH. Each bit line contact 150 may be coupled to each channel pad 136. The bit line contact 150 may include a conductive material. Thereafter, bit lines BL may be formed on the second interlayer insulating layer 140.

Any of the elements and/or functional blocks disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

In concluding the detailed description, those of ordinary skill in the art will appreciate that many variations and modifications may be made to various example embodiments without substantially departing from the principles. Therefore, example embodiments are used in a generic and descriptive sense only and not for purposes of limitation. Furthermore example embodiments are not necessarily mutually exclusive. For example, some example embodiments may include one or more features described with reference to one or more figures, and may also include one or more other features described with reference to one or more other figures.

What is claimed:

1. A lithography model simulation method comprising:

receiving a first mask image;

generating a second mask image by simulating an optical model on the first mask image;

generating at least one third mask image by simulating a quenching model on the second mask image; and generating a resist image by performing machine learning on the first mask image, the second mask image, and the third mask image, wherein the generating of the resist image comprises:

outputting first output data by convolving the first mask image with a first kernel;

outputting second output data by convolving the second mask image with a second kernel;

outputting third output data by convolving the at least one third mask image with a third kernel; and adding together the first to third output data, and wherein each of the first to third kernels includes a free-form kernel.

2. The lithography model simulation method of claim 1, wherein each of the first to third kernels has an initial value based on a Gaussian function.

3. The lithography model simulation method of claim 1, wherein a consistency of a lithography model is determined by comparing a critical dimension of the first mask image with a critical dimension of the resist image.

4. The lithography model simulation method of claim 1, wherein the free-form kernel includes a convolution kernel in which all elements independently represent arbitrary matrices.

5. The lithography model simulation method of claim 1, wherein the machine learning comprises a convolutional neural network.

6. The lithography model simulation method of claim 1, wherein the outputting of the third output data by convolving the third mask image with the third kernel comprises outputting first sub data by convolving a first sub mask image with a first sub kernel, outputting second sub data by convolving a second sub mask image with a second sub kernel, and adding together the first sub data and the second sub data.

7. The lithography model simulation method of claim 6, wherein each of the first sub kernel and the second sub kernel includes a free-form kernel.

8. The lithography model simulation method of claim 6, wherein the first sub kernel and the second sub kernel have an initial value based on a Gaussian function.

9. The lithography model simulation method of claim 1, further comprising:

performing an upsampling operation after generating the resist image.

10. A photomask fabrication method comprising:

performing an optical proximity correction (OPC) process on a design pattern of a layout; and fabricating a photomask based on the corrected layout, wherein the OPC process is performed using a model designed through the lithography model simulation method of claim 1.

11. The photomask fabrication method of claim 10, wherein the OPC process comprises generating a target pattern for the design pattern and generating a correction pattern based on the target pattern.

12. The photomask fabrication method of claim 10, wherein a consistency of a lithography model is determined by comparing a critical dimension of the first mask image with a critical dimension of the resist image.

13. The photomask fabrication method of claim 10, wherein each of the first to third kernels has an initial value based on a Gaussian function.

14. The photomask fabrication method of claim 10, wherein the free-form kernel is a convolution kernel in which all entries are independently represented.

15. The photomask fabrication method of claim 10, wherein the outputting of the third output data by convolving the third mask image with the third kernel comprises outputting first sub data by convolving a first sub mask image with a first sub kernel, outputting second sub data by convolving a second sub mask image with a second sub kernel, and adding together the first sub data and the second sub data.

16. The photomask fabrication method of claim 15, wherein each of the first sub kernel and the second sub kernel is a free-form kernel.

17. The photomask fabrication method of claim 15, wherein the first sub kernel and the second sub kernel have an initial value based on a Gaussian function.

18. The photomask fabrication method of claim 10, further comprising performing an upsampling operation after generating the resist image.

19. A semiconductor device fabrication method comprising:

providing a substrate;

forming a sacrificial structure by alternately stacking insulating layers and sacrificial layers on the substrate;

forming channel holes that penetrate the sacrificial structure; and replacing the sacrificial layers with gate electrodes, wherein the forming of the channel holes comprises:

designing a layout that defines the channel holes;

performing an optical proximity correction (OPC) process on the designed layout using a model designed through a lithography model simulation method; and performing a photolithography process using a photomask fabricated based on the corrected layout, wherein the lithography model simulation model method comprises:

receiving a first mask image;

generating a second mask image by simulating an optical model on the first mask image;

generating at least one third mask image by simulating a quenching model on the second mask image; and generating a resist image by applying a convolutional neural network to the first mask image, the second mask image, and the at least one third mask image, wherein the generating of the resist image comprises:

outputting first output data by convolving the first mask image with a first kernel;

outputting second output data by convolving the second mask image with a second kernel;

outputting third output data by convolving the third mask image with a third kernel; and adding together the first to third output data;

wherein each of the first to third kernels is a free-form kernel, and wherein the free-form kernel includes a convolution kernel in which all items independently represent arbitrary matrices.

20. The semiconductor device fabrication method of claim 19, wherein each of the first to third kernels has an initial value based on a Gaussian function.

* * * * *